(12) United States Patent
Tsai

(10) Patent No.: US 6,966,674 B2
(45) Date of Patent: Nov. 22, 2005

(54) BACKLIGHT MODULE AND HEAT DISSIPATION STRUCTURE THEREOF

(75) Inventor: Yi-Shiuan Tsai, Kaohsiung (TW)

(73) Assignee: AU Optronics Corp., Hsinchu (TW)

( * ) Notice: Subject to any disclaimer, the term of this patent is extended or adjusted under 35 U.S.C. 154(b) by 16 days.

(21) Appl. No.: 10/780,821

(22) Filed: Feb. 17, 2004

(65) Prior Publication Data
US 2005/0180142 A1    Aug. 18, 2005

(51) Int. Cl.[7] .............................................. F21V 29/00
(52) U.S. Cl. ...................................... 362/294; 362/373
(58) Field of Search ............................... 362/294, 373, 362/31; 257/720

(56) References Cited
U.S. PATENT DOCUMENTS

| | | | | |
|---|---|---|---|---|
| 5,782,555 A | * | 7/1998 | Hochstein | 362/373 |
| 5,785,418 A | * | 7/1998 | Hochstein | 362/373 |
| 5,857,767 A | | 1/1999 | Hochstein | 362/294 |
| 6,582,100 B1 | * | 6/2003 | Hochstein et al. | 362/294 |
| 6,787,999 B2 | * | 9/2004 | Stimac et al. | 315/51 |
| 2004/0264195 A1 | * | 12/2004 | Chang et al. | 362/294 |

* cited by examiner

Primary Examiner—Thomas M. Sember
Assistant Examiner—James W Cranson, Jr.
(74) Attorney, Agent, or Firm—Thomas, Kayden, Horstemeyer & Risle

(57) ABSTRACT

A backlight module and heat dissipation structure thereof. The heat dissipation structure is used for a backlight module which comprises a circuit board having a through hole with a light emitting diode (LED) corresponding thereto and disposed on one side of the circuit board. The heat dissipation structure comprises a heat conducting portion thermo-conductively connected to the LED and positioned in the through hole, a thermal conductive element disposed between the heat conducting portion and the LED, and a heat dissipating portion thermo-conductively connected to the heat conducting portion. Heat from the LED is conducted through the thermal conductive element and the heat conducting portion to the heat dissipation portion.

19 Claims, 3 Drawing Sheets

BACKLIGHT MODULE AND HEAT DISSIPATION STRUCTURE THEREOF

BACKGROUND OF THE INVENTION

1. Field of the Invention

The present invention relates to a heat dissipation structure for a backlight module, and in particular to a heat dissipation structure with improved dissipation efficiency and easier assembly in a backlight module.

2. Description of the Related Art

Light emitting diodes (LED) often used as a light source for conventional backlight modules, requiring heat dissipation. As shown in FIG. 1, an LED 20 is disposed on a circuit board 10 having a through hole 12. Heat dissipation column 30 is soldered to the LED and positioned in the through holes for efficient heat dissipation. However, such structure is not easily assembled and can damage the LED during assembly.

Another conventional heat dissipation structure is disclosed in U.S. Pat. No. 5,857,767 and shown in FIG. 2. In addition to the heat dissipation column 30 as in FIG. 1, a heat dissipation plate 40 with fins is attached to the heat dissipation column 30 to improve efficiency. However in such structure, the assembly is more complicated.

Thus an improved heat dissipation structure is needed to address the problems described.

SUMMARY OF THE INVENTION

Accordingly, an object of the invention is to provide a heat dissipation structure with improved case of assembly and dissipation efficiency. The heat dissipation structure of the invention comprises a heat conducting portion thermo-conductively connected to the back of an LED positioned in a through hole of a circuit board, a thermal conductive element disposed between the heat conducting portion and the LED, and a heat dissipating portion thermo-conductively connected to the heat conducting portion.

The thermal conductive element contacts the LED and the heat conducting portion closely to reduce the thermal resistance therebetween.

The thermal conductive element can be a soft thermal conductive pad or paste to fill the gap between the heat conducting portion and the LED without damaging the LED.

The heat conducting portion and the heat dissipating portion are formed integrally to simplify assembly.

The heat conducting portion comprises a heat conducting column, and the heat dissipating portion comprises a heat dissipating plate.

The material of the heat conducting portion and the heat dissipating portion can be metal or plastic with high thermal conductivity.

The invention also provides a backlight module, comprising a housing, a circuit board having a plurality of through holes, and disposed on the housing, a plurality of light emitting diodes (LEDs) corresponding to the through holes, disposed on and electrically connected to the circuit board, a plurality of heat conducting portions thermo-conductively connected to the back of the LEDs and disposed in the through holes, a plurality of thermal conductive elements disposed between the LEDs and the heat conducting portions and at least one heat dissipation portion thermo-conductively connected to the heat conducting portions and positioned between the circuit board and the housing.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
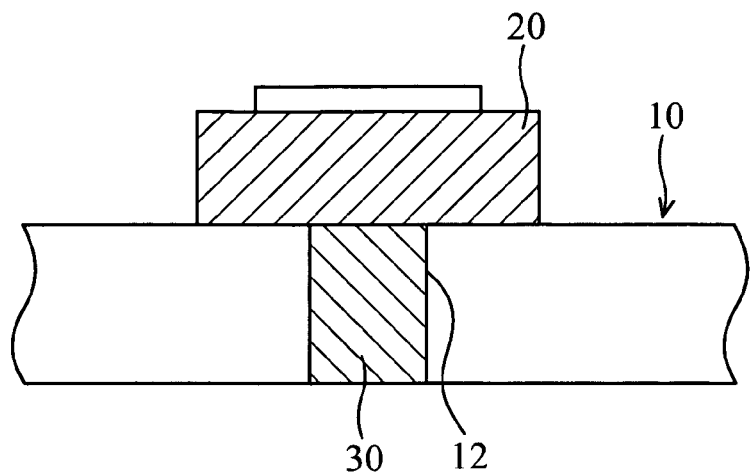
FIG. 1 is a cross section of a heat dissipation structure used in a conventional backlight module.
Figure 2:
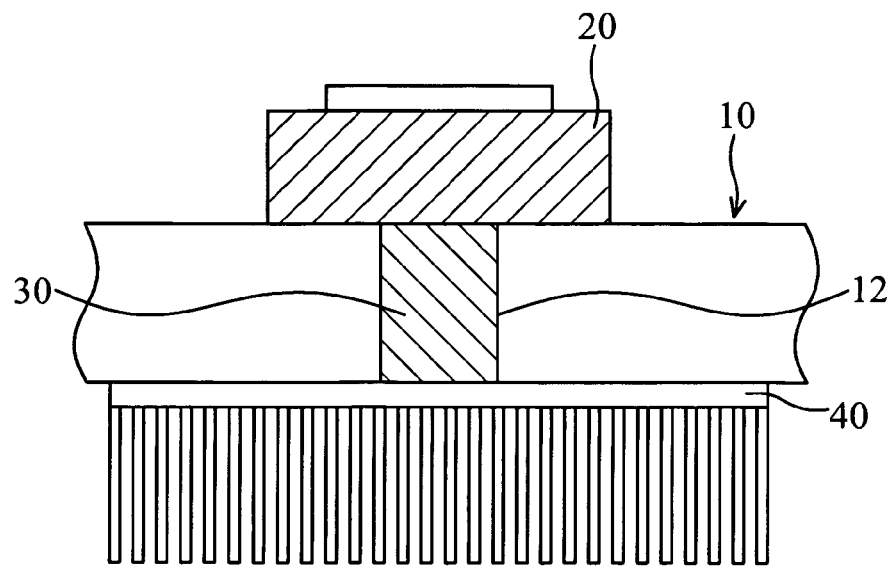
FIG. 2 is a cross section of another heat dissipation structure used in a conventional backlight module.
Figure 3:
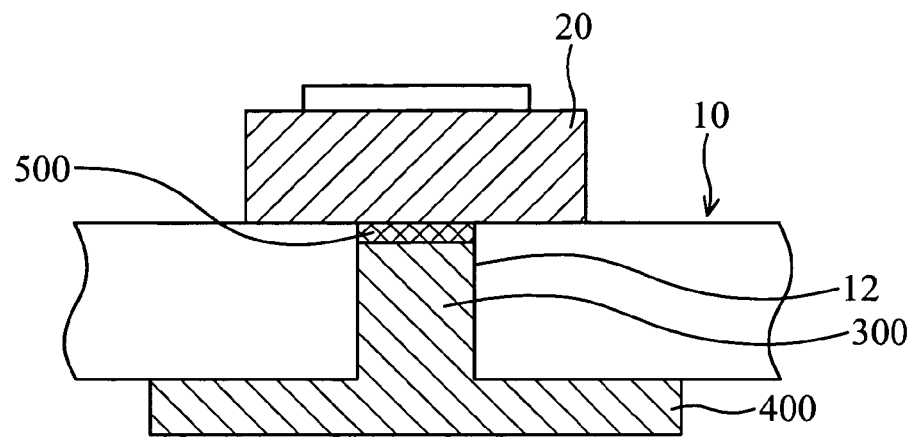
FIG. 3 is a cross section of a heat dissipation structure used in the present invention.

Referring to FIG. 3, an LED 20 is disposed on and electrically connected to a printed circuit board 10. The heat dissipation structure in the invention comprises a heat conducting column 300 connected to the back of the LED 20 with one end thereof via a thermal conductive element 500 and further comprises a heat dissipating plate 400 connected to the other end of the heat conducting column 300 and positioned near the back of the circuit board 10. The heat dissipating plate 400 and the heat conducting column 300 are formed integrally and configured. Thereby, the heat of the LED 20 is conducted along the thermal conductive element 500 and the heat conducting column 300 to the heat dissipating plate 400.

The heat conducting column 300 is made of metal such as copper or aluminum or plastic with high thermal conductivity. The thermal conductive element 500 can be a soft thermal conductive pad or paste contacting the heat conducting column 300 and the LED 20. Thereby the thermal resistance between the heat conducting column 300 and the LED 20 is reduced.

Figure 4:
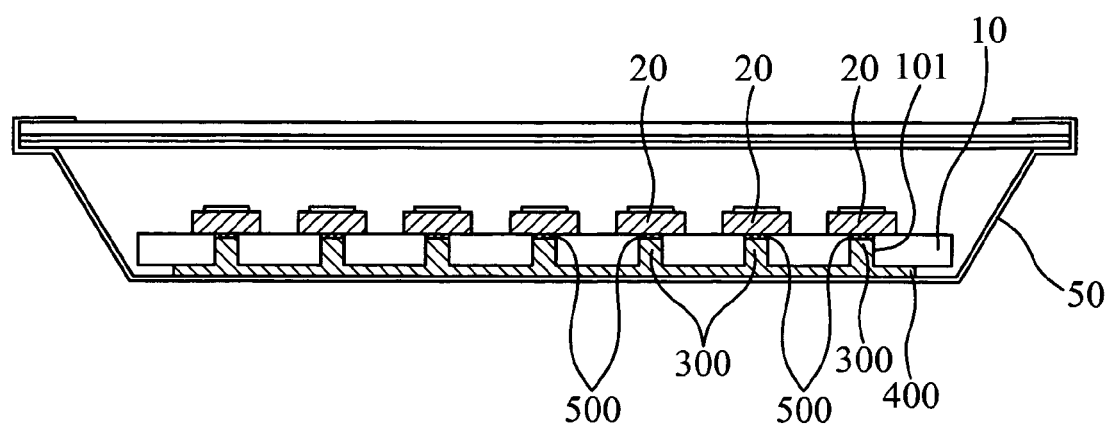
FIG. 4 is a cross section of a direct-type backlight module in the invention.

FIG. 4 shows the heat dissipation structure applied to a direct-type backlight module. The backlight module has several LEDs 20 disposed on a circuit board 10 as a light source thereof. Heat conducting columns 300 are connected to the corresponding LEDs 20 via thermal conductive elements 500. The circuit board 10 has through holes 101 through which the heat conducting columns 300 extends. The heat dissipating plate 400 is attached to the heat conducting columns 300.

As shown in FIG. 4, only one heat dissipating plate 400 connects to the several heat conducting columns 300. However, each heat conducting column 300 can also be connected to a separate corresponding heat dissipating plate 400. Additionally two heat conducting columns can be connected to one heat dissipating plate and other 5 conducting columns connected to another heat dissipating plate.

In addition, the heat dissipating plate 400 may directly contact the housing 50, thereby dissipating heat.

Figure 5:
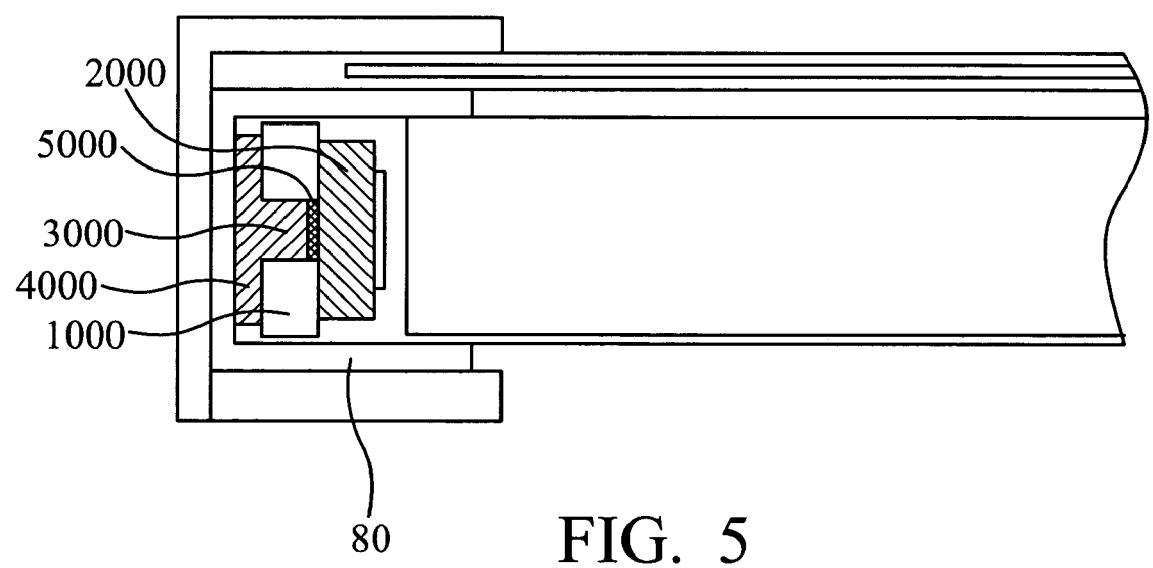
FIG. 5 is a cross section of an edge-mounted backlight module in the invention.

FIG. 5 shows the heat dissipation structure applied to an edge-mounted backlight module. As shown in FIG. 5, a circuit board 1000 is disposed on a side frame 80. An LED 2000 is mounted on and electrically connected to the circuit board 1000. A heat conducting column 3000 is connected to the LED 2000 via a thermal conductive element 5000. A heat dissipating plate 4000 is connected to one end of the heat conducting column 3000, contacting with the frame 80.

The heat dissipation structure of the invention is thermally connected to the LED via the thermal conductive element to alleviate assembly difficulty and prevent damage to the LEDs. The heat conducting column and heat dissipating plate are formed integrally to simplify the assembly problem.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art) Therefore, the scope of the appended claims should be accorded the broadest interpretation so as to encompass all such modifications and similar arrangements.

What is claimed is:

1. A heat dissipation structure for a backlight module comprising a circuit board having a through hole with a light emitting diode (LED) corresponding thereto, disposed on one side of the circuit board, comprising:
   a heat conducting portion thermo-conductively connected to the LED and positioned in the through hole;
   a thermal conductive element disposed between the heat conducting portion and the LED, the thermal conducting element being made of a soft material that is not damaging to the LED; and
   a heat dissipating portion thermo-conductively connected to the heat conducting portion.

2. The heat dissipation structure as claimed in claim 1, wherein the thermal conductive element contacts the heat conducting portion and the LED.

3. The heat dissipation structure as claimed in claim 2, wherein the thermal conductive element comprises a thermal conductive pad.

4. The heat dissipation structure as claimed in claim 2, wherein the thermal conductive element comprises a layer of thermal conductive paste.

5. The heat dissipation structure as claimed in claim 1, wherein the heat conducting portion and the heat dissipating portion are integrally formed.

6. The heat dissipation structure as claimed in claim 1, wherein the heat conducting portion comprises a heat conducting column.

7. The heat dissipation structure as claimed in claim 1, wherein the heat dissipation portion comprises a heat dissipation plate.

8. The heat dissipation structure as claimed in claim 1, wherein the heat conducting portion and the heat dissipation portion are made of metal.

9. The heat dissipation structure as claimed in claim 1, wherein the heat conducting portion and the heat dissipation portion are made of engineering plastic.

10. A backlight module, comprising:
    a housing;
    a circuit board having a plurality of through holes and disposed on the housing;
    a plurality of light emitting diodes (LEDs) corresponding to the through holes and disposed on and electrically connected to the circuit board;
    a plurality of heat conducting portions thermo-conductively connected to the LEDs and disposed in the through holes;
    a plurality of thermal conductive elements disposed in the through hole and sandwiched between the LEDs and the heat conducting portions; and
    at least one heat dissipation portion thermo-conductively connected to the heat conducting portions and positioned between the circuit board and the housing.

11. The backlight module as claimed in claim 10, wherein the heat dissipation portion contacts the housing.

12. The backlight module as claimed in claim 10, wherein the thermal conductive element contacts the heat conducting portion and the LED.

13. The backlight module as claimed in claim 12, wherein the thermal conductive element comprises a thermal conductive pad.

14. The backlight module as claimed in claim 12, wherein the thermal conductive element comprises a layer of thermal conductive paste.

15. The backlight module as claimed in claim 10, wherein the heat conducting portion and the heat dissipating portion are integrally formed.

16. The backlight module as claimed in claim 10, wherein the heat conducting portion comprises a heat conducting column.

17. The backlight module as claimed in claim 10, wherein the heat dissipation portion comprises a heat dissipation plate.

18. The backlight module as claimed in claim 10, wherein the heat conducting portion and the heat dissipation portion are made of metal.

19. The backlight module as claimed in claim 10, wherein the heat conducting portion and the heat dissipation portion are made of engineering plastic.

* * * * *